United States Patent [19]
Devin

[11] Patent Number: 5,950,224
[45] Date of Patent: Sep. 7, 1999

[54] ELECTRICALLY MODIFIABLE NON-VOLATILE MEMORY CIRCUIT HAVING MEANS FOR AUTONOMOUS REFRESHING DEPENDENT UPON ON PERIODIC CLOCK PULSES

[75] Inventor: Jean Devin, Aix En Provence, France

[73] Assignee: SGS-Thomas Microelectronics S.A., Saint Genis, France

[21] Appl. No.: 08/797,948

[22] Filed: Feb. 12, 1997

[30] Foreign Application Priority Data

Feb. 20, 1996 [FR] France .................................. 96 02300

[51] Int. Cl.[6] ...................................................... G06F 12/16
[52] U.S. Cl. ...................... 711/106; 365/222; 365/185.25
[58] Field of Search .......................... 365/185.11, 185.22, 365/185.03, 222, 185.25; 395/750.03; 711/106

[56] References Cited

U.S. PATENT DOCUMENTS

| | | | |
|---|---|---|---|
| 5,239,505 | 8/1993 | Fazio et al. ......................... | 365/185.11 |
| 5,327,363 | 7/1994 | Akiyama ................................. | 364/580 |
| 5,365,486 | 11/1994 | Shreck ................................ | 365/185.22 |
| 5,638,320 | 6/1997 | Wong et al. ....................... | 365/185.03 |
| 5,740,454 | 4/1998 | Kelly et al. ........................ | 395/750.03 |

FOREIGN PATENT DOCUMENTS

| | | | |
|---|---|---|---|
| 0 420 388 A3 | 3/1991 | European Pat. Off. ...... | G01R 31/318 |
| 0 656 628 A2 | 6/1995 | European Pat. Off. ........ | G11C 16/06 |

OTHER PUBLICATIONS

French Search Report from French application No. 9602300, filed Feb. 20, 1996.

*Primary Examiner*—Tod R Swann
*Assistant Examiner*—David Langjahr
*Attorney, Agent, or Firm*—Wolf, Greenfield & Sacks, P.C.

[57] ABSTRACT

An electrically modifiable multilevel non-volatile memory has autonomous refresh means. The multilevel memory has a real-time clock delivering pulses to periodically activate an operation for refreshing the memory cells of the main matrix. The memory has application to the field of large-capacity memories, for example, several tens of megabits and more.

52 Claims, 3 Drawing Sheets

ELECTRICALLY MODIFIABLE NON-VOLATILE MEMORY CIRCUIT HAVING MEANS FOR AUTONOMOUS REFRESHING DEPENDENT UPON ON PERIODIC CLOCK PULSES

BACKGROUND OF THE INVENTION

1. Field of the Invention

The invention relates to an electrically modifiable multilevel non-volatile memory comprising autonomous refresh means. The invention can be applied more particularly in the field of large-capacity memories, with capacities of the order of several tens of megabits or more.

2. Discussion of the Related Art

There are several techniques for increasing the density of memories. One technique consists of the storage of several bits of information in one and the same memory cell. The memories made with such memory cells are known as multilevel memories.

Standard memories store one information bit per memory cell, namely one of two programming states. These states correspond to the presence or absence of electrical charges in the floating gate of the transistor constituting the elementary memory cell. The multilevel memories for their part can store a larger number of programming states per memory cell.

Patent EP 0 340 107 describes an electrically modifiable non-volatile multilevel memory. Each cell of the memory is capable of memorizing n possible programming states, with n being at least equal to three. These different programming states are obtained by bringing about a variation in the conduction threshold of the floating-gate transistor that constitutes the memory cell. To obtain this variation in conduction threshold, the cell is programmed to a greater or to a lesser degree by varying the intensity of the programming, namely by varying either the voltage applied to the cell or the period of application of the voltage. To read the information elements contained in the memory, a current or a voltage as a function of the programming state of the cell is compared with n-1 main reference values in order to deduce therefrom the programming state of the memory cell from among n possible states.

However, the physical phenomena brought into play by the programming of such memories are poorly controlled in industrial applications. The result thereof is that the currents coming from the reference cells and the program cells are not known with great precision. They depend on many factors, including read voltage values applied to the cells. The current coming from a programmed cell depends on the intensity of the programming, namely on the quantity of the electrical charges injected into its floating gate. This quantity of charges depends on the programming voltage and on the period of application of this voltage, and even on the way in which it has been applied. There is therefore a very great variation between the values of current of reference cells and of programmed cells even in a batch of memories of the same make.

Additionally, uncontrolled shifts of electrical charges may occur during the memory programming or erasure operations. For example, during the programming of a memory cell of a FLASH EPROM type multilevel memory, a high voltage Vpp is applied to the word line connected to the control gate of the cell and a lower voltage Vp is applied to the bit line connected to the drain of the cell. The sources of all the cells belonging to the same sector are connected to the ground during the programming. The cells connected to the same word line are then subjected to an electrical field which may be responsible for a shifting of electrical charges.

Furthermore, the programming state of a programmed memory cell deteriorates in the course of time, i.e. the floating gate of the memory cells tend to lose electrical charges with time. The retention period of a memory cell is of the order of 10 years. For conditions of high temperature, this deterioration is further accelerated.

Finally, a large number of write cycles applied to the cell may also alter the quality of the dielectric located between the floating gate of the cell and the substrate. Thus, a cell that has been frequently brought into play risks losing or gaining electrical charges more easily than another cell.

All these variations are all the more disadvantageous as, in multilevel memories, the ranges of voltage or current representing the different programming states are more limited due to their large number.

In view of all these possible variations of the programming state of a cell, intermediate reference values are provided. These intermediate reference values define ranges of safety that make it possible to avert any loss of a programming state. They are used to refresh the memory cells. For this purpose, the reading current of a cell is compared with these intermediate reference values and it is thus determined whether the cell must undergo an additional programming operation.

It can seen therefore that FLASH EPROM type multilevel memories, although they are nonvolatile, need to be permanently refreshed.

Usually, the operation for refreshing the memory or a sector of the memory is done under the control of a control unit external to the memory. Any access to the memory during the refresh operation is then impossible.

Furthermore, the refresh operation is generally activated after a writing (programming or erasure) operation in the memory in order to correct the disturbances that might be caused by this type of operation. This mode of refreshing does not take account of the phenomena of losses of electrical charges with time, especially for memory cells that are frequently used.

SUMMARY OF THE INVENTION

An object of the invention is to overcome these drawbacks.

One embodiment of the invention is directed to an electrically modifiable non-volatile memory block comprising a first matrix of non-volatile memory cells capable of memorizing at least two information bits, this first matrix being divided into sectors, first addressing means and means for the programming of the first matrix, first read and write circuits associated with the first matrix, a control circuit to control the entire unit, wherein the memory block further comprises refreshing means under the control of the control circuit and a real-time clock delivering pulses for the periodic activation of an operation to refresh the memory cells of the first matrix.

Thus, the refresh operation in the memory block of the invention may be performed autonomously and does not require any external command.

Furthermore, in one embodiment, the refresh operation is performed periodically to overcome the effects of any phenomenon of gain or loss of electrical charges at the floating gates of the memory cells.

In at least one embodiment, the refresh operation is done sector by sector.

According to a particular aspect of the invention, the memory has a second matrix of static memory cells. The refresh operation is then carried out in two steps.

A first step duplicates, in the second matrix, information elements contained in a sector of the first matrix. A second step refreshes the cells of the sector of the first matrix containing these information elements.

Thus, the information elements of the cells which are in the course of being refreshed can be accessed in read mode from the second matrix without disturbing the progress of the refresh step.

BRIEF DESCRIPTION OF THE DRAWINGS

Other features and advantages of the invention shall appear from the following detailed description, made with reference to the appended drawings, of which.

DETAILED DESCRIPTION

Figure 1:
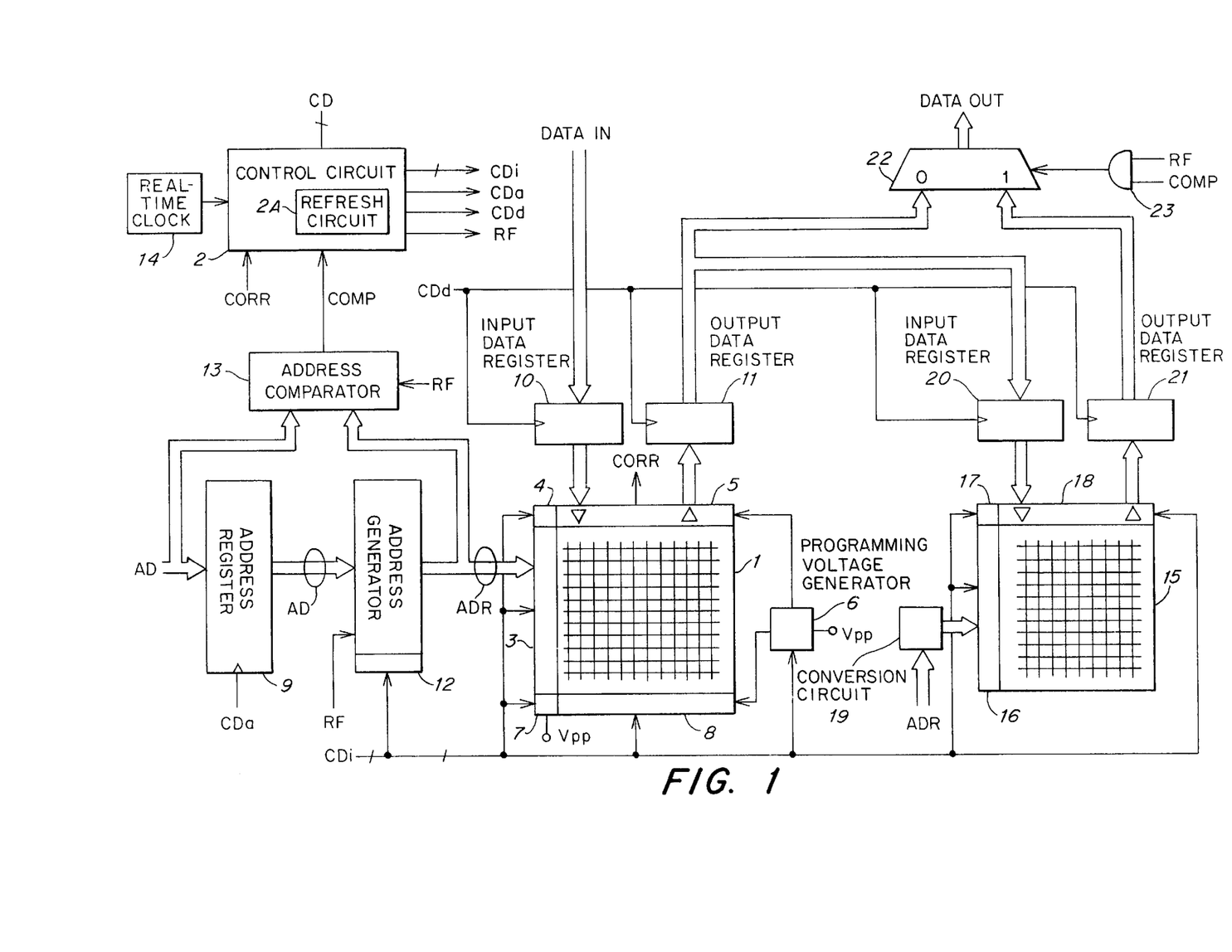
FIG. 1 shows an exemplary embodiment of the memory according to an embodiment of the invention.

FIG. 1 illustrates an exemplary embodiment of the memory block according to an embodiment of the invention. As a non-restrictive example, the multilevel memory is of the FLASH EEPROM type.

The memory block has a matrix 1 of non-volatile memory cells capable of memorizing several information bits. These memory cells are connected to a row decoder 3 and a column decoder 4 itself associated with read and write circuits 5.

In the case of a FLASH EEPROM type memory, each cell may be formed by a floating-gate transistor whose conduction threshold is electrically modifiable by the application to its electrodes of an appropriate voltage. Thus, for this type of memory, there is provided a generator of programming voltages for the columns 6 supplying the drains by means of the read and write circuits 5 and supplying the sources by means of a circuit 8 for the supply of the sources. There is also provided a row supply circuit 7 enabling the application to the gates of the programming voltage. These power supply means receive a potential Vpp delivered by a circuit referred to as a high voltage generator (not shown).

In practice, a FLASH EEPROM memory may be divided into sectors. Each of these sectors comprises a matrix of memory cells provided with a row decoder and a column decoder, associated read and write circuits as well as circuits for the supply of the rows and columns. With a view to readability, a single sector has been shown in FIG. 1.

The decoders 3 and 4 are connected to an address register 9. The read and write circuits 9 are connected to an input data register 10 and to an output data register 11. The set of circuits 3 to 8 is controlled by a control circuit 2.

The control circuit 2 comprises refresh circuit 2A, and interprets external control signals CD and internal control signals CORR and COMP. As a function of this interpretation, the control circuit 2 provides control signals CDa, CDd, CDi and RF. According to at least one embodiment, the internal control signals CDa, CDd, CDi, and RF travel through an internal control bus.

The control circuit 2 may be a programmed unit, for example of the programmable logic array (PLA) type, that drives all the circuits of the memory such as the supply circuits 6, 7 and 8. The control circuit 2 chiefly has the role of controlling the operations for reading, programming and erasing the cells of the memory.

The memory block communicates with external circuitry by means of an interface circuit (not shown) that receives read and write commands associated with address information elements to receive the data elements to be written and that delivers the data elements which were read.

In one embodiment, the control circuit 2 sends out control signals CDa, CDd and CDi designed respectively for the address registers, data registers and the other circuits of the memory block. A refresh signal RF is also provided to indicate that a refresh operation is in progress.

To represent an exemplary implementation of the invention, FIG. 1 illustrates additional circuits. First, a real-time clock 14 may be associated with the control circuit 2. The value of the clock 14 may be saved, for example by a lithium cell that is integrated into the memory.

In one embodiment, the real-time clock 14 periodically delivers clock pulses to the control circuit 2. Each pulse then activates an operation, at the control circuit 2, for refreshing the memory cells of the matrix 1.

An address generator 12 may also be associated with each sector of the matrix 1, to produce the addresses ADR of the set of cells of the sector during the refresh operation. In one embodiment, this generator 12 is interposed between the address register 9 and the line decoder 3 and column decoder 4. When it is not activated for the refreshing of the sector associated with it, the address generator 12 may directly send the column and row decoders the address AD associated with an external command and, in at least one case, the address AD is equal to the address ADR.

Furthermore, an address comparator 13 may be provided to compare the external addresses AD and the addresses ADR generated by the address generator 12 during the refresh operations. This comparator 13 can be used to determine whether the address associated with an external read or write command belongs to the sector of the matrix 1 being refreshed. In one embodiment, a comparison signal COMP representing the result of the comparison is transmitted to the control circuit 2.

The control circuit 2 may also receive a correction signal CORR sent out by the read circuits. In one embodiment, this correction signal CORR activates an additional programming of the cell being refreshed or an erasure of the sector followed by a reprogramming operation. The address generator 12 and the comparator 13 may be activated by the refresh signal RF.

According to at least one embodiment, there is provided a second matrix 15 of static memory cells organized in rows and columns so that the data elements of the sector being refreshed are accessible in read mode from the second matrix 15 during the refresh step. Static memory cells are used in one embodiment, because the period of a write cycle in a static cell is generally very short as compared with that of a dynamic cell or a redundant non-volatile cell. Furthermore, the selection of the rows of the second matrix 15 is achieved by means of a row decoder 16 while the columns are selected by a column decoder 17 associated with read and write circuits 18.

In one embodiment, the refresh operation associated with this type of structure takes place in two steps: a step for the duplication in the second matrix of the data elements of a sector of the first matrix, and a step for the refreshing of the cells of the duplicated sector of the first matrix.

The step for the refreshing of a sector may be performed cell by cell. The correction signal CORR coming from the read circuit associated with the cell read informs the control circuit 2 whether the cell needs to be corrected. The correction consists of either an additional programming of the cell or an erasure followed by a reprogramming of the sector associated with the cell.

The row decoder 16 and column decoder 17 each receives an address given by a conversion circuit 19. This conversion circuit is aimed at converting the address ADR into an address adapted to the matrix 15. In one embodiment, the size of the matrix 15 is equal to the size of a sector of the matrix 1. The new address coming from the conversion circuit 19 is therefore devoid of any sector indication in this embodiment. For example, the conversion circuit 19 may eliminate the bits of the address ADR indicating a matrix sector, generally the most significant bits.

In one embodiment, the read and write circuits 18 are connected to an input data register 20 and an output data register 21. The input data register 20 is linked with an output data register 11 for the duplication of the data elements of the sector to be refreshed. Furthermore, a multiplexer 22 may receive the data elements coming from the two output registers 11 and 21, and select the data elements to be given to the output of the memory. The output of an AND gate 23 may be connected to the selection input of the multiplexer 22. The signals COMP and RF may be applied to the inputs of the AND gate 23. Thus, in one embodiment, the data elements delivered by the memory block following an external read command come from the matrix of static cells if the sector concerned is the sector being refreshed.

Apart from the refresh operations, the operations of reading and writing in the matrix 1 are typically performed in the same way as for a standard non-volatile memory under the control of the control circuit 2.

Figure 2:
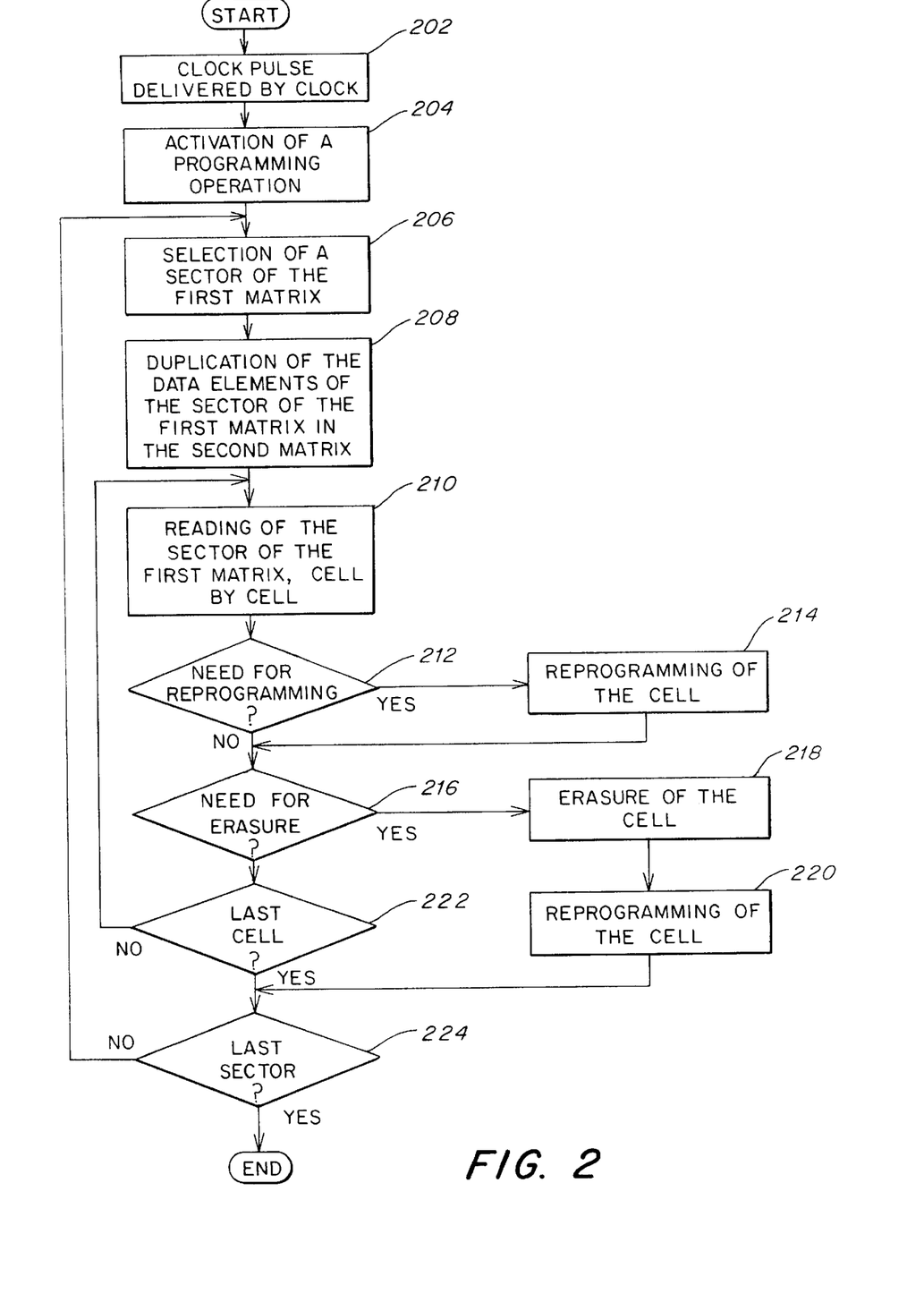
FIG. 2 is a flow chart of an operation for the refreshing of the memory block according to an embodiment of the invention.

FIG. 2 shows a flow chart of a refresh operation suited to the memory block of FIG. 1 and other embodiments of the invention. Following a clock signal delivered by the real-time clock 14 (step 202), the control circuit 2 activates a refresh operation (step 204). A first sector of the matrix 1 is selected in step 206. In step 208, the data elements of the selected sector are duplicated in the second matrix 15. The sectors not concerned by the refresh operation in progress are accessible in read mode and in write mode from the external commands.

The duplication step is followed by a refresh step in which the cells of the selected sector are read one after the other (step 210). To perform this step in one embodiment, the address generator 12 of the sector being refreshed gives addresses to the row decoder 3 and the column decoder 4. To determine the programming state of the cell read, the current coming from the cell subjected to the read voltage may be compared with main reference levels. The current may also be compared with intermediate reference levels to ascertain that the cell read must undergo a complementary programming operation or be erased and then reprogrammed.

Figure 3:
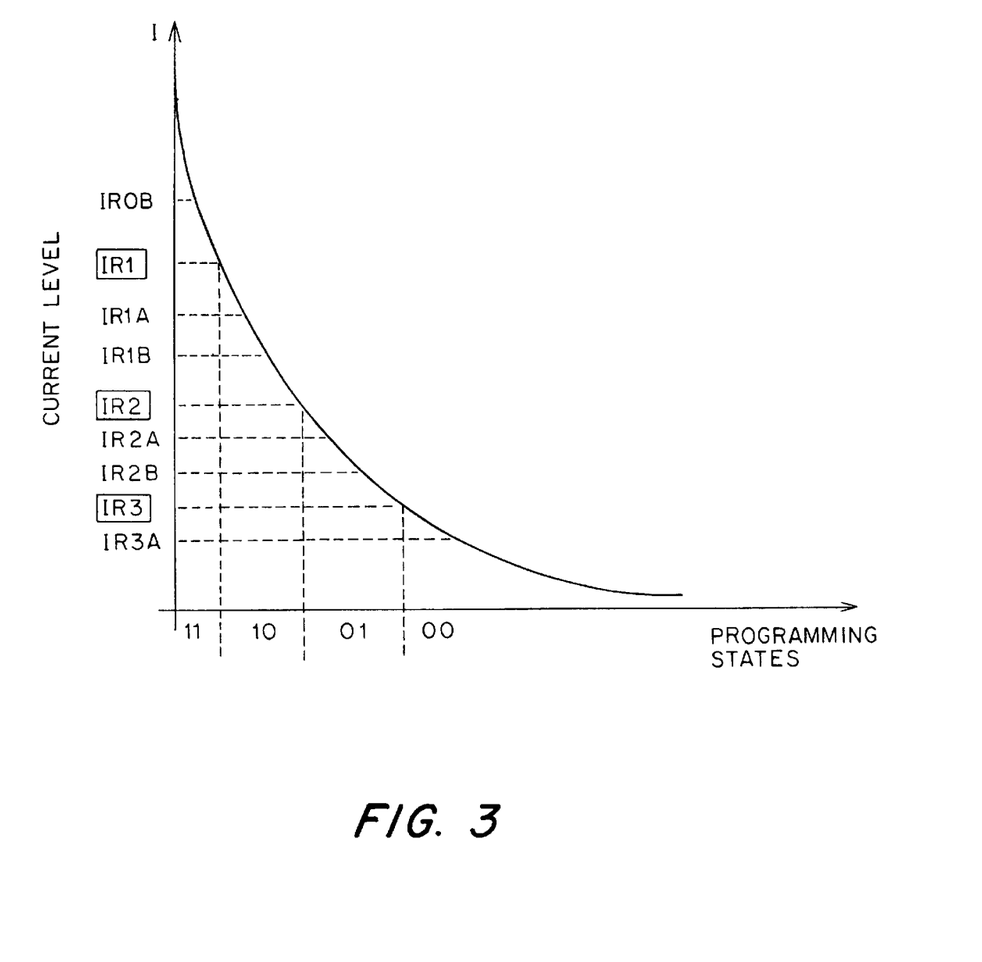
FIG. 3 gives a schematic view of a current curve generated in read mode by a memory cell as a function of its programming.

FIG. 3 gives a schematic view of a current curve generated in read mode by a memory cell as a function of the memory cell's programming. In particular, FIG. 3 illustrates the case of a memory block where the cells are capable of memorizing four programming states by using two information bits. The main reference values IR1, IR2 and IR3 are current levels enabling the definition of four programming states. The state 11 corresponds to a cell which, in read mode, generates a current greater than the level IR1. The state 10 corresponds to a cell which, in read mode, generates a current ranging from the level IRI to the level IR2. The state 01 corresponds to a cell which, in read mode, generates a current ranging from the level IR2 to the level IR3. Finally, the state 00 corresponds to a cell which, in read mode, generates a current lower than the level IR3.

Intermediate reference levels are also defined by current levels IR0B, IR1A, IR1B, IR2A, IR2B and IR3A.

These intermediate reference levels define security zones. In an embodiment of this type of memory, it is assumed that a cell that may be programmed at the nth state (the state 11 is the first state) must not only give a current ranging from IRn-1 to IRn but more specifically give a current ranging from IRn-1A to IRn-1B. If the read current of the cell ranges from IRn-1 to IRn-1A, it is assumed that the cell is insufficiently programmed and the cell may undergo an additional programming. Conversely, if the read current of the cell ranges from IRn-1B to IRn, the cell may be erased. The erasure may be done comprehensively in a FLASH type memory. The entire sector containing the cell may be erased, and the sector will then be reprogrammed.

Referring again to FIG. 2, each cell of the matrix is thus read so as to determine whether the cell needs to undergo a reprogramming operation or an erasure operation followed by a reprogramming operation. Corresponding reprogramming commands or erasure commands may be transmitted to the control circuit 2 by means of the correction signal CORR.

Should the cell be insufficiently programmed, as determined in step 212, it undergoes a complementary programming (step 214), for example in the form of voltage pulses applied to the gate of the memory cell. The operation then goes to the following cell (step 222).

Should the cell need an erasure, as determined in step 216, the sector associated with the cell is erased (step 218) and reprogrammed entirely (step 220). The operation then goes directly to the next sector, as indicated in step 224.

All the cells of the matrix 1 are thus verified. At the end of each elementary refresh step, the address generator is incremented in the embodiment shown in FIG. 1.

Furthermore, there may be provided an autonomous power supply device (not shown) to supply the memory block so that the refresh operation takes place normally when the device comprising the memory block is not powered. It is possible to control the activation of the autonomous power supply device at each clock pulse 14 for a certain duration when there is no power supply provided by the system.

As described above with respect to at least one embodiment of the invention, the data elements of matrix 1 remain accessible in read mode during the refresh operation. Indeed, if it is sought to read a data element belonging to a sector different from the sector being refreshed, the reading may be done conventionally without any interruption of the refresh operation. On the contrary, if it is sought to read a data element stored in a sector being refreshed, there are two possible cases. If the duplication of the sector of the matrix 1 has been completed, the corresponding data element is read in the matrix 15. If not, the duplication is interrupted and the data element is read in the matrix 1.

Furthermore, any writing (programming or erasure) operation activated by an external command on a sector of the matrix 1 may modify the matrix refresh operation. If the address associated with the write command indicates a sector of the matrix 1 being refreshed, the refresh operation is interrupted to make way for the writing operation. The refresh operation is then resumed in the next sector. It is possible to insert the refreshing means of the invention into standard memories.

If the write operation relates to a sector other than the one being refreshed, the write operation may take place conventionally, without any interruption of the refresh operation.

According to one exemplary embodiment, the refresh operation takes place every hour.

Having thus described at least one illustrative embodiment of the invention, various alternations, modifications, and improvements will readily occur to those skilled in the art. Such alternations, modifications, and improvements are intended to be within the spirit and scope of the invention. Accordingly, the foregoing description is by way of example only, and not intended to be limiting. The invention is limited only as defined in the following claims and the equivalents thereto.

What is claimed is:

1. An electrically modifiable memory, comprising:
    a first matrix of memory cells, each of which is capable of storing at least two information bits, the first matrix being divided into sectors;
    an address circuit, coupled to the first matrix, for addressing the memory cells in the first matrix;
    a programming circuit, coupled to the first matrix, for programming the memory cells in the first matrix;
    a read circuit, coupled to the first matrix, for reading from the memory cells in the first matrix;
    a write circuit, coupled to the first matrix, for writing to the memory cells in the first matrix;
    a control circuit, coupled to the first matrix, the address circuit, the programming circuit, the read circuit, and the write circuit;
    a refresh circuit, coupled to the control circuit and receiving periodic clock pulses, the refresh circuit activating an operation to refresh the memory cells of the first matrix in response to the periodic clock pulses; and
    a second matrix of static memory cells, the second matrix of static memory cells containing memory values that are stored in a first sector of the first matrix while the first sector is being refreshed, so that the memory values of the first sector may be accessed from the second matrix while the first sector is being refreshed.

2. The electrically modifiable memory of claim 1, wherein the operation to refresh the memory cells is preformed sector by sector.

3. The electrically modifiable memory of claim 1, further comprising:
    a second address circuit, coupled to the second matrix, for addressing the static memory cells in the second matrix;
    wherein the operation to refresh the memory cells is performed in a duplication step for the duplication, in the second matrix, of information elements contained in a sector of the first matrix, and a refresh step for refreshing the memory cells of the first matrix containing the set of information elements.

4. The electrically modifiable memory of claim 3, wherein the second matrix includes a number of static memory cells that is equal to a number of non-volatile memory cells in a sector of the first matrix.

5. The electrically modifiable memory of claim 1, wherein the refresh operation is performed substantially every hour.

6. The electrically modifiable memory of claim 1, wherein each of the memory cells in the first matrix includes a non-volatile memory cell.

7. The electrically modifiable memory of claim 1, further comprising a clock circuit, coupled to the refresh circuit, that provides the periodic clock pulses to the refresh circuit.

8. The electrically modifiable memory of claim 1, further comprising an address comparator, coupled to the an address circuit, the address comparator receiving an address from an external circuit for a memory cell to be accessed and an address defining a sector to be refreshed, and providing as an output a signal indicative of whether the memory cell to be accessed is within the sector to be refreshed.

9. The electrically modifiable memory of claim 1, wherein the read circuit includes an output indicative of whether a memory cell has an output current at a magnitude indicative that correction of data within the memory cell is valid.

10. A method for operating a memory, comprising the steps of:
    receiving a clock input;
    in response to the clock input, determining that a refresh operation for a first group of a plurality of groups of memory cells within the memory will be performed; and
    performing the refresh operation for the first group of the plurality of groups of memory cells;
    wherein, in response to the memory losing power. a value from the clock input is stored in nonvolatile memory.

11. The method of claim 10, wherein each of the first group of memory cells includes a memory cell that stores multiple bits of data.

12. The method of claim 10, further comprising the steps of:
    generating the clock input; and
    in response to power being applied to the memory, re-initializing the clock input to the value that was stored in the non-volatile memory.

13. The method of claim 10, further comprising the steps of:
    determining that the refresh operation for the first group of memory cells is complete; and
    response to the refresh operation for the first group of memory cells being complete, performing a refresh operation for a second group of the plurality of groups of memory cells within the memory.

14. The method of claim 10, further comprising the step of transferring data from the first group to a storage area that is different from the first group of memory cells, so that the storage area may be accessed during the refresh operation of the first group of memory cells.

15. The method of claim 14, further comprising the step of accessing the storage area during the refresh operation to obtain the data that was previously stored in the first group of memory cells.

16. The method of claim 15, further comprising the steps of:
    determining whether a memory access request is directed to a cell within the first group of memory cells while the first group of memory cells is being refreshed;
    when the memory access request is directed to a cell within the first group of memory cells, accessing the storage area; and
    when the memory access request is not directed to a cell within the first group of memory cells, accessing a second group of memory cells.

17. The method of claim 14, wherein the first group of memory cells is in a first memory matrix, and the storage area is in a second memory matrix that is different from the first memory matrix.

18. The method of claim 10, wherein the step of performing the refresh operation for the first group includes the steps of:
  determining a read current from one of the first group of memory cells;
  in response to a magnitude of the read current, determining that a refresh will be performed; and
  refreshing by re-writing a value into the one of the first group of memory cells.

19. A method for operating a memory, comprising the steps of:
  detecting that a refresh operation is activated for a first group of memory cells within the memory;
  transferring data from the first group of memory cells to a second group of memory cells so that the second group of memory cells may be accessed during the refresh operation of the first group of memory cells; and
  transferring data from the second group of memory cells back to the first group of memory cells subsequent to the refresh operation of the first group of memory cells.

20. The method of claim 19, wherein each of the first group of memory cells is capable of storing a plurality bits of data, the method further comprising the step of refreshing each of the first group of memory cells.

21. The method of claim 20, wherein the step of refreshing includes the steps of:
  determining a read current from one of the first group of memory cells;
  in response to a magnitude of the read current, determining that a refresh will be performed; and
  performing the refresh by re-writing a value into the one of the first group of memory cells.

22. The method of claim 19, further comprising the step of accessing the second group of memory cells during the refresh operation to obtain the data that was previously stored in the first group of memory cells.

23. The method of claim 19, further comprising the steps of:
  determining whether a memory access request is directed to a cell within the first group of memory cells while the first group of memory cells is being refreshed;
  when the memory access request is directed to a cell within the first group of memory cells, accessing the second group of memory cells to respond to the memory access request; and
  when the memory access request is not directed to a cell within the first group of memory cells, accessing the second group of memory cells to respond to the memory access request.

24. The method of claim 19, wherein the first group is in a first memory matrix, and the second group of memory cells is in a second memory matrix that is different from the first memory matrix.

25. An apparatus for operating a memory, comprising:
  means, operative in response to a clock input, for determining that a refresh operation for a first group of a plurality of groups of memory cells within the memory will be performed;
  means for performing the refresh operation for the first group of the plurality of groups of memory cells;
  means, operative in response to the memory losing power, for storing a value from the clock input in non-volatile memory.

26. The apparatus of claim 25, wherein each of the first group of memory cells includes a memory cell that stores multiple bits of data.

27. The apparatus of claim 25, further comprising:
  means for generating the clock input; and
  means, operative in response to power being applied to the memory, for re-initializing the clock input to the value that was stored in the non-volatile memory.

28. The apparatus of claim 26, further comprising:
  means for determining that the refresh operation for the first group of memory cells is complete; and
  means, operative in response to the refresh operation for the first group of memory cells being complete, for performing a refresh operation for a second group of the plurality of groups of memory cells within the memory.

29. The apparatus of claim 25, further comprising means for transferring data from the first group to a storage area that is different from the first group of memory cells, so that the storage area may be accessed during the refresh operation of the first group of memory cells.

30. The apparatus of claim 29, further comprising means for accessing the storage area during the refresh operation to obtain the data that was previously stored in the first group of memory cells.

31. The apparatus of claim 30, further comprising:
  means for determining whether a memory access request is directed to a cell within the first group of memory cells while the first group of memory cells is being refreshed;
  means for accessing the storage area when the memory access request is directed to a cell within the first group of memory cells, and
  means for accessing a second group of memory cells, when the memory access request is not directed to a cell within the first group of memory cells.

32. The apparatus of claim 29, wherein the first group of memory cells is in a first memory matrix, and the storage area is in a second memory matrix that is different from the first memory matrix.

33. The apparatus of claim 25, wherein the means for performing the refresh operation for the first group includes:
  means for determining a read current from one of the first group of memory cells;
  means, operative in response to a magnitude of the read current, for determining that a refresh will be performed; and
  means for refreshing by re-writing a value into the one of the first group of memory cells.

34. An apparatus for operating a memory, comprising:
  means for detecting that a refresh operation is activated for a first group of memory cells within the memory;
  means for transferring data from the first group of memory cells to a second group of memory cells so that the second group of memory cells may be accessed during the refresh operation of the first group of memory cells; and
  means for transferring data from the second group of memory cells back to the first group of memory cells subsequent to the refresh operation of the first group of memory cells.

35. The apparatus of claim 34, wherein each of the first group of memory cells is capable of storing a plurality bits of data, the apparatus further comprising means for refreshing each of the first group of memory cells.

36. The apparatus of claim 35, wherein the means for refreshing includes:
means for determining a read current from one of the first group of memory cells;
means, operative in response to a magnitude of the read current, for determining that a refresh will be performed; and
means for performing the refresh by re-writing a value into the one of the first group of memory cells.

37. The apparatus of claim 34, further comprising means for accessing the second group of memory cells during the refresh operation to obtain the data that was previously stored in the first group of memory cells.

38. The apparatus of claim 34, further comprising:
means for determining whether a memory access request is directed to a cell within the first group of memory cells while the first group of memory cells is being refreshed;
means for accessing the second group of memory cells to respond to the memory access request when the memory access request is directed to a cell within the first group of memory cells, and
means for accessing the second group of memory cells to respond to the memory access request when the memory access request is not directed to a cell within the first group of memory cells.

39. The apparatus of claim 34, wherein the first group is in a first memory matrix, and the second group of memory cells is in a second memory matrix that is different from the first memory matrix.

40. A memory apparatus comprising:
a plurality of memory cells arranged in a plurality of groups of memory cells;
a refresh control circuit having an input that receives a clock signal and an output that provides a signal indicative that a refresh operation will be performed on a first group of the plurality of groups of memory cells within the memory apparatus;
a refresh circuit, having an input that receives the indicator signal and an output that controls the refresh operation for the first group of the plurality of groups of memory cells; and
a storage area that is different from the first group of memory cells, the storage area storing data that was previously stored in the first group of memory cells, so that the storage area may be accessed during the refresh operation of the first group of memory cells.

41. The memory apparatus of claim 40, wherein each of the first group of memory cells includes a memory cell that stores multiple bits of data.

42. The memory apparatus of claim 40, further comprising:
a clock generator having an output that provides the clock signal to the input of the refresh control circuit, the clock generator; and
a storage circuit, coupled to the clock generator, that stores a clock signal value from the clock generator in response to the memory losing power.

43. The memory apparatus of claim 40, wherein the refresh control circuit is constructed and arranged to perform a refresh operation for a second group of the plurality of groups of memory cells within the memory apparatus in response to the refresh operation for the first group of memory cells being complete.

44. The memory apparatus of claim 40, wherein the first group of memory cells is in a first memory matrix, and the storage area is in a second memory matrix that is different from the first memory matrix.

45. The memory apparatus of claim 40, further comprising a comparator circuit having a first input that receives an address indicative of a memory access request, a second input that receives an address indicative of the first group of cells, the comparator providing as an output a signal indicative of whether the memory access request is directed to a cell within the first group of memory cells while the first group of memory cells is being refreshed.

46. The memory apparatus of claim 40, wherein:
the refresh circuit has an input that receives a read current from one of the first group of memory cells; and
the refresh circuit determines whether a refresh will be performed based upon a magnitude of the read current.

47. A memory apparatus, comprising:
a first group of memory cells;
an indicator circuit that provides a signal indicative that a refresh operation is activated for the first group of memory cells;
a second group of memory cells, distinct from the first group of memory cells, the second group of memory cells storing data from the first group of memory cells so that the second group of memory cells may be accessed during the refresh operation of the first group of memory cells.

48. The memory apparatus of claim 47, wherein each of the first group of memory cells is capable of storing a plurality bits of data, the apparatus further comprising a refresh circuit having an output that refreshes each of the first group of memory cells.

49. The memory apparatus of claim 48, wherein:
the refresh circuit has an input that receives a read current from one of the first group of memory cells; and
the refresh circuit determines whether a refresh will be performed based upon a magnitude of the read current.

50. The memory apparatus of claim 47, further comprising a read circuit having an output that accesses the second group of memory cells during the refresh operation to obtain the data that was previously stored in the first group of memory cells.

51. The memory apparatus of claim 47, further comprising a comparator circuit having a first input that receives an address indicative of a memory access request, a second input that receives an address indicative of the first group of cells, the comparator providing as an output a signal indicative of whether the memory access request is directed to a cell within the first group of memory cells while the first group of memory cells is being refreshed.

52. The memory apparatus of claim 47, wherein the first group is in a first memory matrix, and the second group of memory cells is in a second memory matrix that is different from the first memory matrix.

* * * * *

UNITED STATES PATENT AND TRADEMARK OFFICE
CERTIFICATE OF CORRECTION

PATENT NO. : 5,950,224

DATED : September 7, 1999

INVENTOR(S): Jean Devin

It is certified that error appears in the above-identified patent and that said Letters Patent is hereby corrected as shown below:

On the title page, item [73] should read:

[73]   Assignee:    SGS-Thomson Microelectronics
                    Saint Genis, France Signed and Sealed this First Day of February, 2000

Attest:

Q. TODD DICKINSON

*Attesting Officer*       *Acting Commissioner of Patents and Trademarks*

UNITED STATES PATENT AND TRADEMARK OFFICE
CERTIFICATE OF CORRECTION

PATENT NO. : 5,950,224
DATED : September 7, 1999
INVENTOR(S) : Jean Devin

It is certified that error appears in the above-identified patent and that said Letters Patent is hereby corrected as shown below:

On the title page, item [73] should read:

[73] Assignee: SGS-Thomson Microelectronics S.A.
Saint Genis, France

This certificate supersedes Certificate of Correction issued February 1, 2000.

Signed and Sealed this

Fourteenth Day of November, 2000

*Attest:*

Q. TODD DICKINSON

*Attesting Officer*     *Director of Patents and Trademarks*